US009484439B1

United States Patent
Cheng et al.

(10) Patent No.: US 9,484,439 B1
(45) Date of Patent: Nov. 1, 2016

(54) III-V FIN ON INSULATOR

(71) Applicant: International Business Machines Corporation, Armonk, NY (US)

(72) Inventors: Kangguo Cheng, Schenectady, NY (US); Hemanth Jagannathan, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/860,285

(22) Filed: Sep. 21, 2015

(51) Int. Cl.
| | |
|---|---|
| H01L 21/8252 | (2006.01) |
| H01L 29/66 | (2006.01) |
| H01L 29/201 | (2006.01) |
| H01L 29/06 | (2006.01) |
| H01L 29/78 | (2006.01) |
| H01L 21/306 | (2006.01) |

(52) U.S. Cl.
CPC ... *H01L 29/66795* (2013.01); *H01L 21/30612* (2013.01); *H01L 29/0615* (2013.01); *H01L 29/201* (2013.01); *H01L 29/66545* (2013.01); *H01L 29/785* (2013.01)

(58) Field of Classification Search
CPC .............. H01L 21/823431; H01L 21/823475; H01L 29/66795; H01L 29/785
See application file for complete search history.

(56) References Cited

U.S. PATENT DOCUMENTS

| | | | |
|---|---|---|---|
| 7,544,976 B2 | 6/2009 | Aulnette et al. | |
| 8,324,030 B2 * | 12/2012 | Bangsaruntip | B82Y 10/00 257/38 |
| 8,541,295 B2 * | 9/2013 | Sleight | H01L 29/66477 257/13 |
| 8,673,718 B2 | 3/2014 | Maszara et al. | |
| 8,816,428 B1 * | 8/2014 | Miller | H01L 21/762 257/329 |
| 8,927,405 B2 * | 1/2015 | Cohen | H01L 29/66484 438/585 |
| 9,385,233 B2 * | 7/2016 | Akarvardar | H01L 29/785 |
| 2007/0200142 A1 | 8/2007 | Lee et al. | |
| 2013/0256784 A1 * | 10/2013 | Vellianitis | H01L 21/76264 257/329 |
| 2014/0217467 A1 | 8/2014 | Pawlak et al. | |
| 2015/0024566 A1 | 1/2015 | Yeh et al. | |
| 2015/0048428 A1 | 2/2015 | Cheng et al. | |
| 2015/0060997 A1 | 3/2015 | Basu et al. | |
| 2015/0061013 A1 | 3/2015 | Basu et al. | |
| 2015/0162403 A1 * | 6/2015 | Oxland | H01L 29/0673 257/27 |
| 2015/0194489 A1 * | 7/2015 | Barraud | H01L 29/1033 257/9 |

* cited by examiner

*Primary Examiner* — Allen Parker
*Assistant Examiner* — Stephen Bradley
(74) *Attorney, Agent, or Firm* — Scully, Scott, Murphy & Presser, P.C.; Daniel P. Morris, Esq.

(57) ABSTRACT

A method of forming a semiconductor structure in which a III-V compound semiconductor channel fin portion is formed on a dielectric material is provided. The method includes forming a III-V material stack on a surface of a bulk semiconductor substrate. Patterning of the III-V material stack is then employed to provide a pre-fin structure that is located between, and in contact with, pre-pad structures. The pre-pad structures are used as an anchoring agent when a III-V compound semiconductor channel layer portion of the III-V material stack and of the pre-fin structure is suspended by removing a topmost III-V compound semiconductor buffer layer portion of the material stack from the pre-fin structure. A dielectric material is then formed within the gap provided by the suspending step and thereafter a fin cut process is employed.

12 Claims, 8 Drawing Sheets

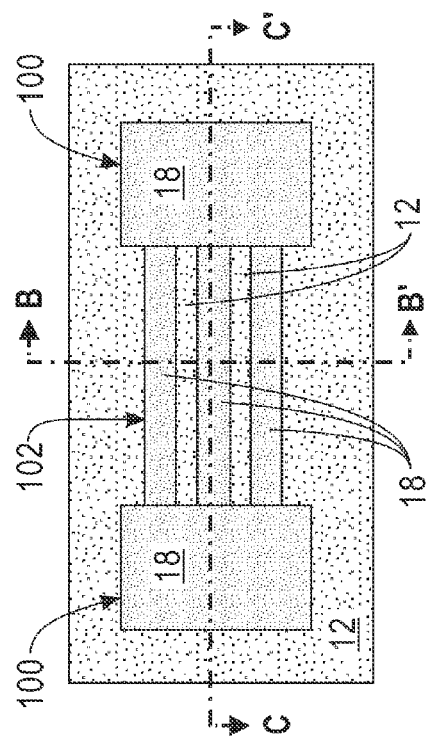
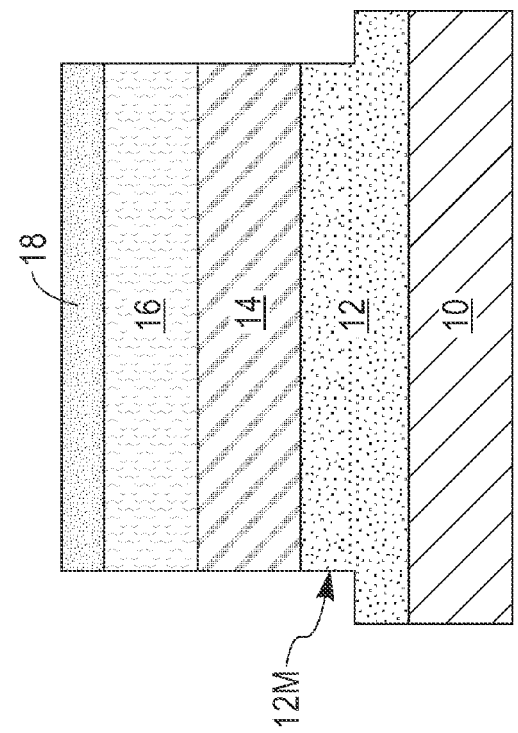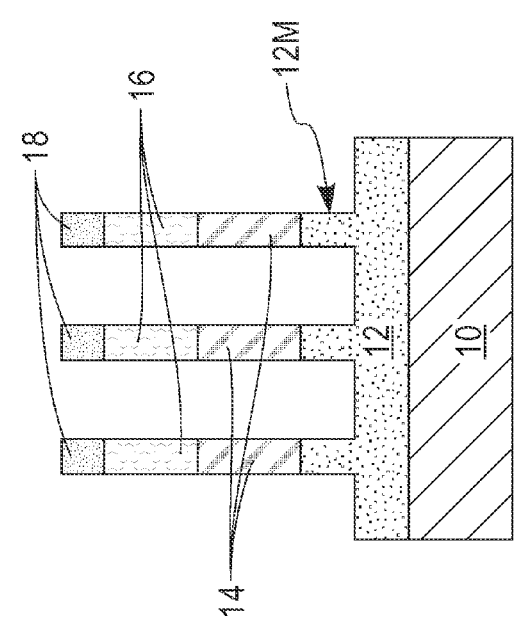

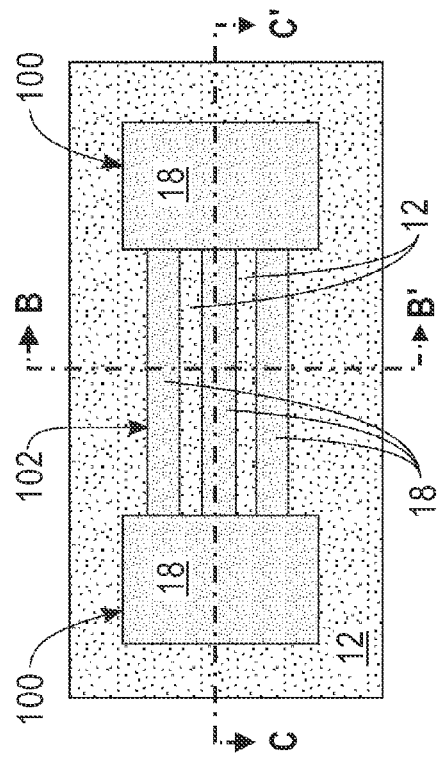
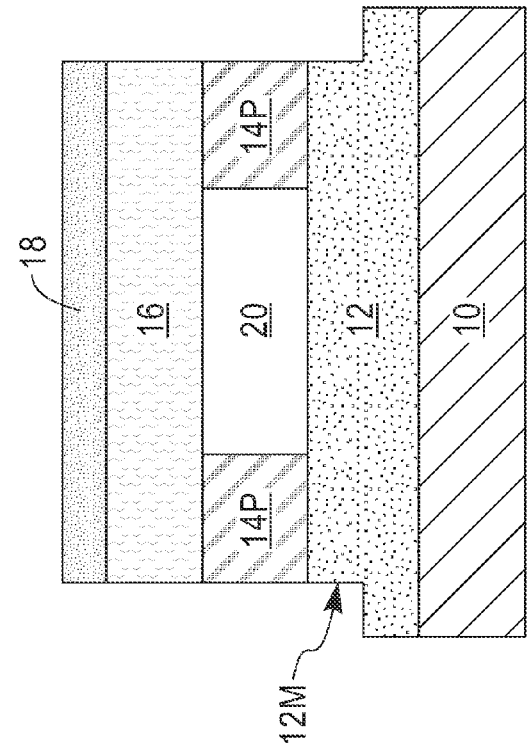
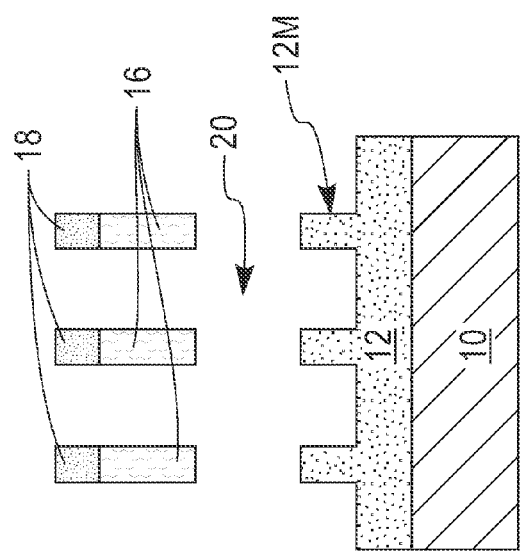
FIG. 3A
FIG. 3B
FIG. 3C

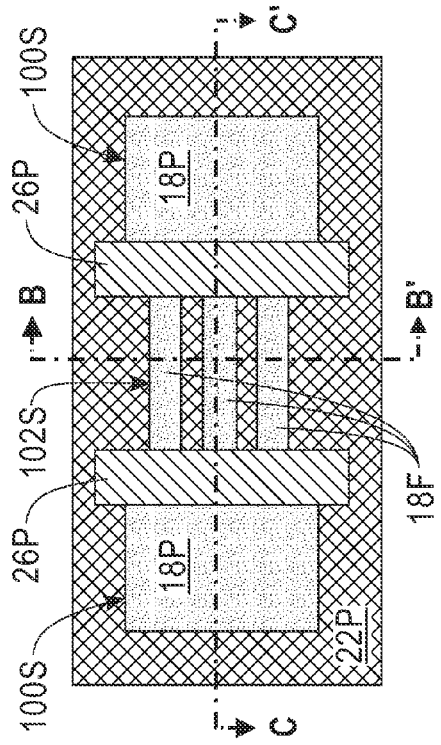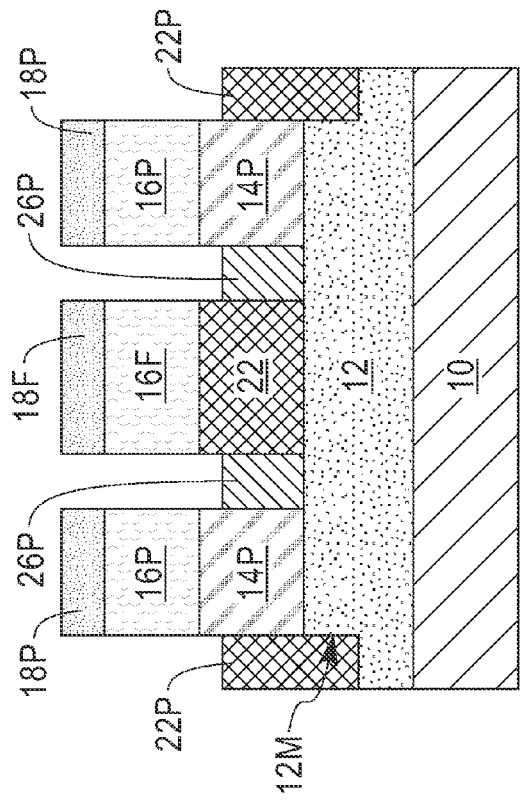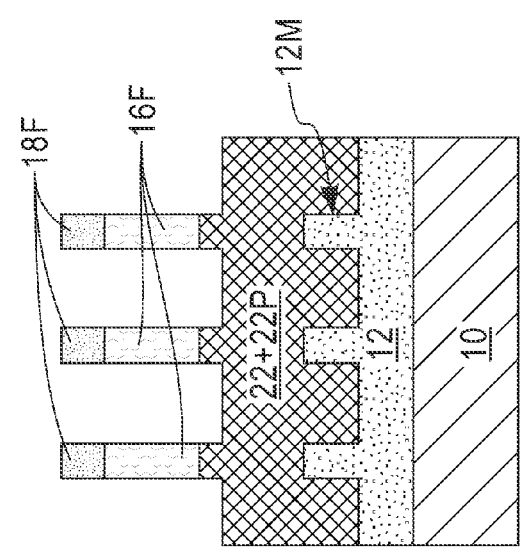

US 9,484,439 B1

III-V FIN ON INSULATOR

BACKGROUND

The present application relates to semiconductor technology, and more particularly to a method of forming a semiconductor structure comprising a III-V compound semiconductor fin that has a bottommost surface located directly on a surface of a dielectric material that is provided atop a surface of a bulk semiconductor substrate.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of complementary metal oxide semiconductor (CMOS) devices. Semiconductor fin field effect transistors (FinFETs) can achieve higher drive currents with increasingly smaller dimensions as compared to conventional planar FETs. In order to extend these devices for multiple technology nodes, there is a need to boost the performance with high mobility semiconductor channel materials such as, for example, III-V compound semiconductor materials. Moreover, semiconductor fins containing a III-V compound semiconductor that are formed on an insulator material would be beneficial for better short channel effects.

SUMMARY

The present application provides a method of forming a semiconductor structure in which a III-V compound semiconductor channel fin portion is formed on a dielectric material. The method includes forming a III-V material stack on a surface of a bulk semiconductor substrate. Patterning of the III-V material stack is then employed to provide a pre-fin structure that is located between, and in contact with, pre-pad structures. The pre-pad structures are used as an anchoring agent when a III-V compound semiconductor channel layer portion of the III-V material stack and of the pre-fin structure is suspended by removing a topmost III-V compound semiconductor buffer layer portion of the material stack from the pre-fin structure. A dielectric material is then formed within the gap provided by the suspending step and thereafter a fin cut process is employed.

In one aspect of the present application, a method of forming a semiconductor structure is provided. In one embodiment of the present application, the method includes providing a III-V material stack on a surface of a bulk semiconductor substrate, the III-V material stack comprising from bottom to top, a first III-V compound semiconductor buffer layer, a second III-V compound semiconductor buffer layer, and a III-V compound semiconductor channel layer. Next, the III-V material stack is patterned to provide at least one pre-fin structure located between and directly contacting a pair of pre-pad structures. A remaining portion of the III-V compound semiconductor channel layer within the at least one pre-fin structure is then suspended using each pre-pad structure as an anchoring element. Next, a first dielectric material is formed surrounding the at least one pre-fin structure and the pair of pre-pad structures, wherein a portion of the first dielectric material fills a gap located between the remaining portion of the III-V compound semiconductor channel layer that is suspended within the pre-fin structure and an underlying remaining portion of the first III-V compound semiconductor buffer layer. Next, a fin cutting process is performed to provide openings separating remaining portions of the at least one pre-fin structure and remaining portions of the pair of pre-pad structures. A second dielectric material is then formed within each opening, the second dielectric material having a topmost surface that is located beneath a bottommost surface of the remaining portion of the III-V compound semiconductor channel layer of the remaining portions of the at least one pre-fin structure.

In another aspect of the present application, a semiconductor structure is provided. In one embodiment of the present application, the semiconductor structure includes a pair of pad structures comprising, from bottom to top, a second III-V compound semiconductor buffer layer pedestal portion and a III-V compound semiconductor channel pad portion, and located on portions of a first III-V compound semiconductor buffer layer. The structure further includes at least one fin structure located between, and spaced apart from, the pair of pad structures, the at least one fin structure comprises a III-V compound semiconductor channel fin portion located on a surface of a first dielectric material, the first dielectric material is located on another portion of the first III-V compound semiconductor buffer layer.

BRIEF DESCRIPTION OF SEVERAL VIEWS OF THE DRAWINGS

FIG. 2A is a top-down view of the exemplary semiconductor structure of FIG. 1 after patterning the hard mask layer, the III-V compound semiconductor channel layer, the second III-V compound semiconductor buffer layer and the first III-V compound semiconductor buffer layer to provide at least one pre-fin structure located between a pair of pre-pad structures.

FIG. 2B is a cross sectional view of the exemplary semiconductor structure of FIG. 2A along vertical plane B-B'.

FIG. 2C is a cross sectional view of the exemplary semiconductor structure of FIG. 2A along vertical plane C-C'.

FIG. 3A is a top-down view of the exemplary semiconductor structure of FIGS. 2A-2C after suspending a remaining portion of the III-V compound semiconductor channel layer of the at least one pre-fin structure utilizing the pair of pre-pad structures as an anchor.

FIG. 3B is a cross sectional view of the exemplary semiconductor structure of FIG. 3A along vertical plane B-B'.

FIG. 3C is a cross sectional view of the exemplary semiconductor structure of FIG. 3A along vertical plane C-C'.

FIG. 7A is a top-down view of the exemplary semiconductor structure of FIGS. 6A-6C after recessing the second dielectric material within each opening provided by the fin cutting step.

FIG. 7B is a cross sectional view of the exemplary semiconductor structure of FIG. 7A along vertical plane B-B'.

FIG. 7C is a cross sectional view of the exemplary semiconductor structure of FIG. 7A along vertical plane C-C'.

DETAILED DESCRIPTION

Figure 1:
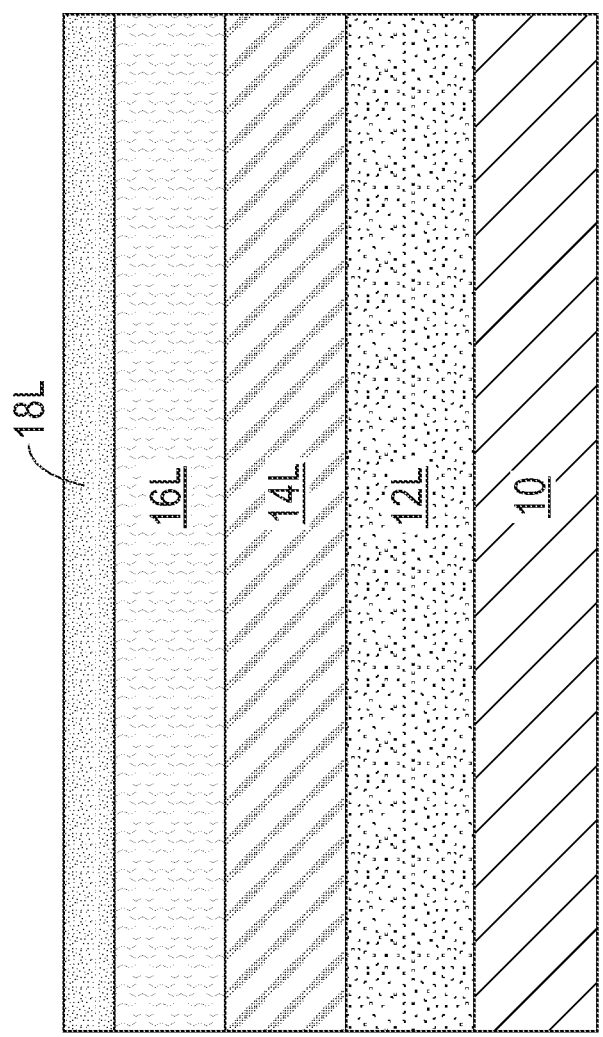
FIG. 1 is a cross sectional view of an exemplary semiconductor structure including from bottom to top, a bulk semiconductor substrate, a first III-V compound semiconductor buffer layer, a second III-V compound semiconductor buffer layer, a III-V compound semiconductor channel layer and a hard mask layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including from bottom to top, a bulk semiconductor substrate 10, a first III-V compound semiconductor buffer layer 12L, a second III-V compound semiconductor buffer layer 14L, a III-V compound semiconductor channel layer 16L and a hard mask layer 18L that can be employed in accordance with an embodiment of the present application. Collectively, the first III-V compound semiconductor buffer layer 12L, the second III-V compound semiconductor buffer layer 14L, and the III-V compound semiconductor channel layer 16L provide a III-V material stack that is formed on a surface of bulk semiconductor substrate 10.

The term "bulk" semiconductor substrate denotes a substrate that is entirely composed of at least one semiconductor material. In one embodiment, the entirety of the bulk semiconductor substrate 10 is comprised of a single semiconductor material. The term "semiconductor material" is used throughout the present application to denote any material whose electrical conductivity is between that of a conductor and an insulator. Examples of semiconductor materials that can be used as the bulk semiconductor substrate 10 include Si, Ge, SiGe, SiC, SiGeC, III-V compound semiconductors or II-VI compound semiconductors. In one embodiment of the present application, at least the uppermost surface of the bulk semiconductor substrate 10 comprises Si.

The semiconductor material that provides the bulk semiconductor substrate 10 is typically a single crystalline semiconductor material such as, for example, single crystalline Si. The semiconductor material that provides the bulk semiconductor substrate 10 may have any of the well known crystal orientations. For example, the crystal orientation of the semiconductor material that provides the bulk semiconductor substrate 10 may be {100}, {110} or {111}.

The first III-V compound semiconductor buffer layer 12L comprises a first semiconductor alloy that contains at least one element from Group III (i.e., Group 13) of the Periodic Table of Elements and at least one element from Group V (i.e., Group 15) of the Periodic Table of Elements. Examples of Group III elements that can be used to provide the first III-V compound semiconductor buffer layer 12L include boron, aluminum, gallium and/or indium. Examples of Group V elements that can be used to provide the first III-V compound semiconductor buffer layer 12L include nitrogen, phosphorus, arsenic, antinomy and/or bismuth. In one embodiment, the first III-V compound semiconductor buffer layer 12L is a semiconductor alloy that consists of two elements such as, for example, GaAs. In another embodiment, the first III-V compound semiconductor buffer layer 12L is a semiconductor alloy that consists of three elements such as, for example, indium gallium arsenide. In still another embodiment, the first III-V compound semiconductor buffer layer 12L may consist of four elements such, as for example, aluminum gallium indium phosphide. In one embodiment, and when the upper surface of the bulk semiconductor substrate 10 comprises a III-V compound semiconductor material, the first III-V compound semiconductor buffer layer 12L may comprise a different III-V compound semiconductor material than the bulk semiconductor substrate 10. In another embodiment, and when the upper surface of the bulk semiconductor substrate 10 comprises a III-V compound semiconductor material, the first III-V compound semiconductor buffer layer 12L may comprise a same III-V compound semiconductor material as the bulk semiconductor substrate 10.

The first III-V compound semiconductor buffer layer 12L can be formed utilizing an epitaxial growth (i.e., deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, the first III-V compound semiconductor buffer layer 12L has an epitaxial relationship with the growth surface of the underlying bulk semiconductor substrate 10.

Examples of various epitaxial growth process apparatuses that are suitable for use in forming the first III-V compound semiconductor buffer layer 12L of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition ranges from 350° C. to 800° C. Although higher temperature typically results in faster deposition, the faster deposition may result in crystal defects and film cracking. A number of well known precursor sources may be used for the epitaxial growth or deposition of the first III-V compound semiconductor buffer layer 12L. In some embodiments, the precursor source (for III-V can be a gas, a high vapor pressure liquid or solid transported via carrier gas) for the deposition of the first III-V compound semiconductor buffer layer 12L may include an admixture of a gas source containing a Group III element and a gas source containing a Group V element. Carrier gases like hydrogen, nitrogen, helium and argon can be used.

The first III-V compound semiconductor buffer layer 12L that is formed on the bulk semiconductor substrate 10 may have a thickness from 200 nm to 1000 nm. Other thicknesses that are lesser than, or greater than, the aforementioned thickness range may however be used as the thickness of the first III-V compound semiconductor buffer layer 12L.

The second III-V compound semiconductor buffer layer 14L is then formed on the first III-V compound semiconductor buffer layer 12L. The second III-V compound semiconductor buffer layer 14L comprises a different III-V compound semiconductor material than that which provides the first III-V compound semiconductor buffer layer 12L. As such, the second III-V compound semiconductor buffer layer 14L has a different etch rate in certain chemical etchants as compared to the etch rate of the first III-V compound semiconductor buffer layer 12L. In one example, and when the first III-V compound semiconductor buffer layer 12L comprises GaAs, then the second III-V compound semiconductor buffer layer 14L may comprise InP.

The second III-V compound semiconductor buffer layer 14L can be formed utilizing an epitaxial growth (or deposition) process as mentioned above for providing the first III-V compound semiconductor buffer layer 12L. Since an epitaxial growth (or deposition) process is used in providing the second III-V compound semiconductor buffer layer 14L, the second III-V compound semiconductor buffer layer 14L has an epitaxial relationship with the underlying growth surface of the first III-V compound semiconductor buffer layer 12L. In some embodiments, the vacuum between the epitaxial growth of the first and second III-V compound semiconductor buffer layers 12L, 14L may be maintained. In other embodiments, the vacuum between the epitaxial growth of the first and second III-V compound semiconductor buffer layers 12L, 14L may be broken.

The second III-V compound semiconductor buffer layer 14L that is formed on the first III-V compound semiconductor buffer layer 12L may have a thickness from 200 nm to 1000 nm. Other thicknesses that are lesser than, or greater than, the aforementioned thickness range may however be used as the thickness of the second III-V compound semiconductor buffer layer 14L.

The III-V compound semiconductor channel layer 16L is then formed on the second III-V compound semiconductor buffer layer 14L. The III-V compound semiconductor channel layer 16L comprises a different III-V compound semiconductor material than that which provides the second III-V compound semiconductor buffer layer 14L. In some embodiments, the III-V compound semiconductor channel layer 16L may comprise a same III-V compound semiconductor material as the first III-V compound semiconductor buffer layer 12L. In yet other embodiments, the III-V compound semiconductor channel layer 16L may comprise a different III-V compound semiconductor material as the first III-V compound semiconductor buffer layer 12L. Notwithstanding the relationship with the first III-V compound semiconductor buffer layer 12L, the III-V compound semiconductor channel layer 16L has a different etch rate in certain chemical etchants as compared to the etch rate of the second III-V compound semiconductor buffer layer 14L. In one example, and when the first III-V compound semiconductor buffer layer 12L comprises GaAs, the second III-V compound semiconductor buffer layer 14L comprises InP, then the III-V compound semiconductor channel layer 16L may comprise InGaAs.

The III-V compound semiconductor channel layer 16L can be formed utilizing an epitaxial growth (or deposition) process as mentioned above for providing the first III-V compound semiconductor buffer layer 12L. Since an epitaxial growth (or deposition) process is used in providing the III-V compound semiconductor channel layer 16L, the III-V compound semiconductor channel layer 16L has an epitaxial relationship with the underlying growth surface of the second III-V compound semiconductor buffer layer 14L. In some embodiments, the vacuum between the epitaxial growth of the second III-V compound semiconductor buffer layer 14L and the III-V compound semiconductor channel layer 16L may be maintained. In other embodiments, the vacuum between the epitaxial growth of the second III-V compound semiconductor buffer layer 14L and the III-V compound semiconductor channel layer 16L may be broken.

The III-V compound semiconductor channel layer 16L that is formed on the second III-V compound semiconductor buffer layer 14L may have a thickness from 20 nm to 100 nm. Other thicknesses that are lesser than, or greater than, the aforementioned thickness range may however be used as the thickness of the III-V compound semiconductor channel layer 16L.

The hard mask layer 18L is then formed on a surface of the III-V compound semiconductor channel layer 16L. The hard mask layer 18L may include a dielectric material such as, for example, silicon dioxide and/or silicon nitride. In one embodiment, the hard mask layer 18L can be formed utilizing a deposition process such as, for example, chemical vapor deposition or plasma enhanced chemical vapor deposition. In another embodiment of the present application, the hard mask layer 18L can be formed utilizing a thermal process such as, for example, thermal oxidation or thermal nitridation. The hard mask layer 18L can have a thickness from 5 nm to 50 nm. Other thicknesses that are lesser than, or greater than, the aforementioned thickness range may also be employed as the thickness of the hard mask layer 18L.

As is shown in FIG. 1, each of the first III-V compound semiconductor buffer layer 12L, the second III-V compound semiconductor buffer layer 14L, the III-V compound semiconductor channel layer 16L and the hard mask layer 18L is a contiguous layer that covers the entirety of the material layer that is located directly beneath the specific layer.

Referring now to FIGS. 2A-2C, there is illustrated the exemplary semiconductor structure of FIG. 1 after patterning the hard mask layer 18L, the III-V compound semiconductor channel layer 16L, the second III-V compound semiconductor buffer layer 14L and the first III-V compound semiconductor buffer layer 12L to provide at least one pre-fin structure 102 located between a pair of pre-pad structures 100.

The at least one pre-fin structure 102 and the pair of pre-pad structures 100 comprise, from bottom to top, a remaining portion of the first III-V compound semiconductor buffer layer 12L, a remaining portion of the second III-V compound semiconductor buffer layer 14L, a remaining portion of the III-V compound semiconductor channel layer 16L, and a remaining portion of the hard mask layer 18L. Each remaining portion of the hard mask layer 18L can be referred to herein as a hard mask layer portion 18, each remaining portion of the III-V compound semiconductor channel layer 16L can be referred to herein as a III-V compound semiconductor channel layer portion 16, each remaining portion of the second III-V compound semiconductor buffer layer 14L can be referred to herein as a second III-V compound semiconductor buffer layer portion 14, and each remaining portion of the first III-V compound semiconductor buffer layer 12L can be referred to herein as a first III-V compound semiconductor buffer layer portion 12. The first III-V compound semiconductor buffer layer portion 12 of the pre-pad structures 100 and the pre-fin structures 102 includes a mesa portion 12M which extends upwards from a lower portion of the first III-V compound semiconductor buffer layer portion 12.

As is shown, one of the pair of pre-pad structures 100 is located at a first end of each pre-fin structure 102, while the other of the pair of pre-pad structures 100 is located at a second end of each pre-fin structure 102. Each pre-pad structure 100 has a first width, while each pre-fin structure 102 has a second width that is less than the first width. In one embodiment, the first width of each pre-pad structure 100 can be from 500 nm to 2000 nm, while the second width of each pre-fin structure 102 can be from 5 nm to 50 nm.

The pre-pad structures 100 can be formed by a pad patterning process, while the pre-fin structures 102 can be formed by a fin patterning process. In one embodiment, the pad patterning process may be performed prior to the fin patterning process. In another embodiment, the fin patterning process may be performed prior to the pad patterning process. Block mask technology can be used to protect areas of the structure shown in FIG. 1 while performing the pad patterning process and fin patterning process.

The pad patterning process may include lithography and etching. Lithography includes forming a photoresist material (not shown) atop a material or material stack to be patterned; in the present application, the photoresist material is formed atop the hard mask layer 18L. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the contiguous layer of hard mask material. The pattern provided by the patterned photoresist material is thereafter transferred into the underlying material layers (i.e., 18L, 16L, 14L and 12L) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. As is shown, the at least one pattern transfer etch is performed entirely through the hard mask layer 18L, the III-V compound semiconductor channel layer 16L, and the second III-V compound semiconductor buffer layer 14L and partially into a portion of the first III-V compound semiconductor buffer layer 12L.

In one embodiment, the fin patterning process may include lithography and etching as defined above. In another embodiment, the fin patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. As is shown, the etch process is performed entirely through the hard mask layer 18L, the III-V compound semiconductor channel layer 16L, and the second III-V compound semiconductor buffer layer 14L and partially into a portion of the first III-V compound semiconductor buffer layer 12L. Upon completion of the pattern transfer, the SIT process concludes by removing the dielectric spacers from the structure. Each dielectric spacer may be removed by etching or a planarization process.

Each pre-fin structure 102 that is formed includes a pair of vertical sidewalls that are parallel to each other. As used herein, a surface is "vertical" if there exists a vertical plane from which the surface does not deviate by more than three times the root mean square roughness of the surface.

Referring now to FIGS. 3A-3C, there is illustrated the exemplary semiconductor structure of FIGS. 2A-2C after suspending a remaining portion of the III-V compound semiconductor channel layer 16L (i.e., the III-V compound semiconductor channel layer portion 16) of the at least one pre-fin structure 102 utilizing the pair of pre-pad structures 100 as an anchor. The suspending the III-V compound semiconductor channel layer portion 16 of the at least one pre-fin structure 102 can be performed utilizing an etching process that is selective in removing the III-V compound semiconductor material that provides the second III-V compound semiconductor buffer layer 14L relative to the III-V compound semiconductor material of both the first III-V compound semiconductor buffer layer 12L and the III-V compound semiconductor channel layer 16L. In one example, and when the second III-V compound semiconductor buffer layer 14L comprises InP, the first III-V compound semiconductor buffer layer 12L comprises GaAs, and the III-V compound semiconductor channel layer 16L comprises InGaAs, the etch used for suspending the III-V compound semiconductor channel layer portion 16 of the at least one pre-fin structure 102 may comprise wet concentrated HCl based chemistry.

As is shown, the etch removes the entirety of the second III-V compound semiconductor buffer layer portion 14 from the pre-fin structure 102, while none of, or only removing a portion of, the second III-V compound semiconductor buffer layer portion 14 from each pre-pad structure 100. Each remaining second III-V compound semiconductor buffer layer portion 14 within each pre-pad structure 100 can be referred to herein as a second III-V compound semiconductor buffer layer pedestal portion 14P. The removal of the entirety of the second III-V compound semiconductor buffer layer portion 14 from the pre-fin structure 102 suspends the III-V compound semiconductor channel layer portion 16 of each pre-fin structure 102 above the first III-V compound semiconductor buffer layer portion 12 such that a gap 20 is present between the bottommost surface of the III-V compound semiconductor channel layer portion 16 of each pre-fin structure 102 and a topmost surface of the III-V compound semiconductor buffer layer portion 12 of each pre-fin structure 102.

Figure 4A:
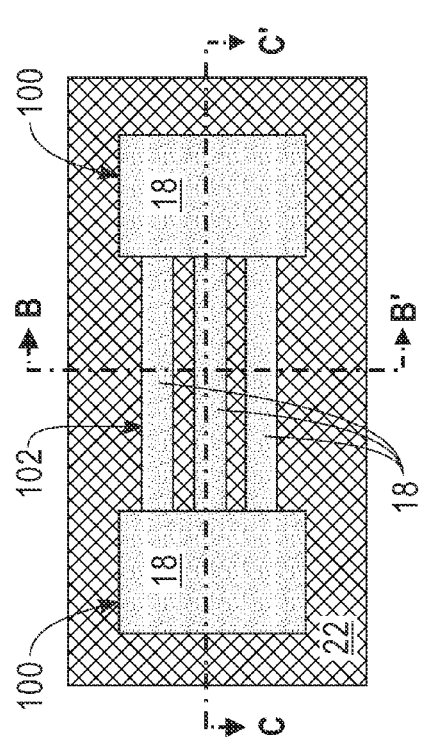
FIG. 4A is a top-down view of the exemplary semiconductor structure of FIGS. 3A-3C after forming a first dielectric material.
Figure 4C:
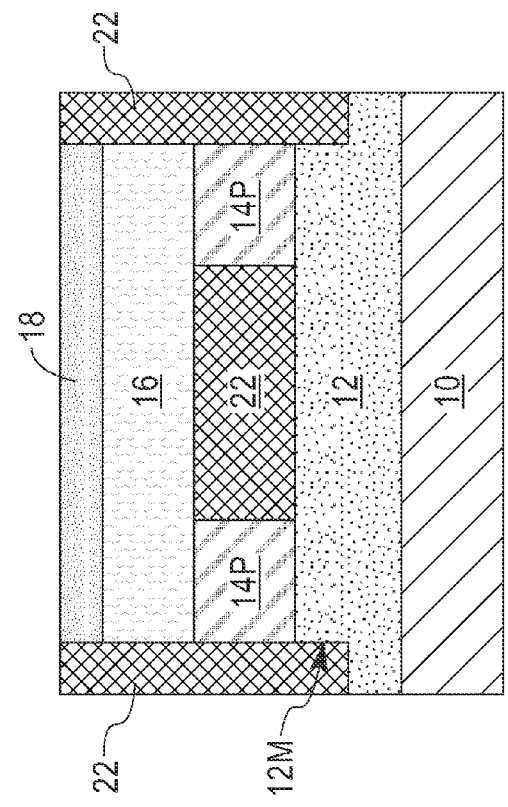
FIG. 4C is a cross sectional view of the exemplary semiconductor structure of FIG. 4A along vertical plane C-C'.
Figure 4B:
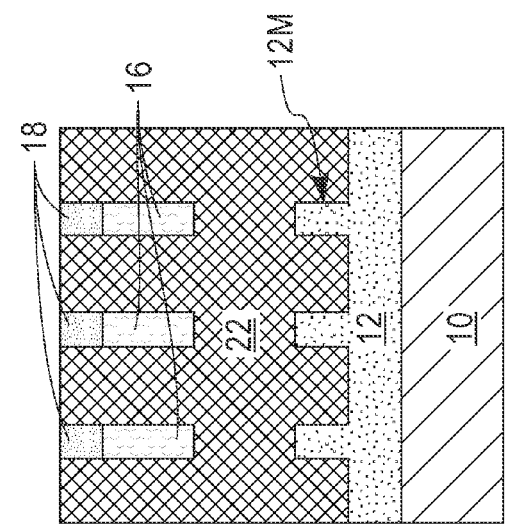
FIG. 4B is a cross sectional view of the exemplary semiconductor structure of FIG. 4A along vertical plane B-B'.

Referring now to FIGS. 4A-4C, there is illustrated the exemplary semiconductor structure of FIGS. 3A-3C after forming a first dielectric material 22. As is shown, the first dielectric material 22 completely fills gap 20 and is formed around the remaining portions of the pre-fin structure 102 and around each pre-pad structure 100. As is further shown, the first dielectric material 22 has a topmost surface that is coplanar with the topmost surface of the remaining pre-fin structure 102 and each remaining pre-pad structure 100, and a bottom surface that contacts underlying portions of the first III-V semiconductor compound layer portion 12. The first dielectric material 22 may comprise a dielectric oxide, a dielectric nitride, a dielectric oxynitride or any combination thereof. In one embodiment of the present application, the first dielectric material 22 comprises a flowable dielectric oxide such as, for example, silicon dioxide.

The first dielectric material 22 can be formed utilizing a deposition process such as, for example, chemical vapor deposition or plasma enhanced chemical vapor deposition. Following the deposition process, an etch back and/or a planarization process such as, for example, chemical mechanical polishing (CMP), may be used to provide the planar structure shown in FIGS. 4A-4C.

Figure 5A:
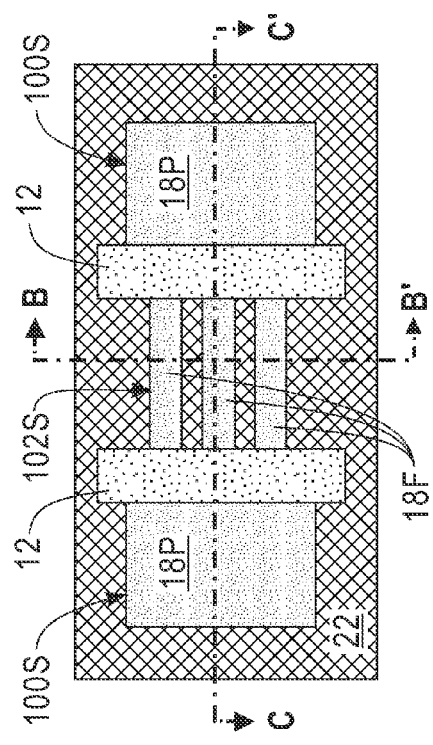
FIG. 5A is a top-down view of the exemplary semiconductor structure of FIGS. 4A-4C after performing a fin cutting step.
Figure 5C:
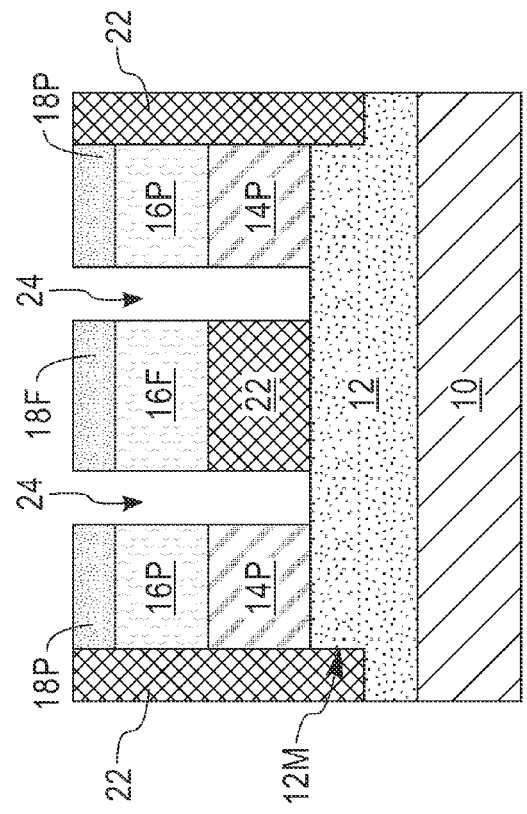
FIG. 5C is a cross sectional view of the exemplary semiconductor structure of FIG. 5A along vertical plane C-C'.
Figure 5B:
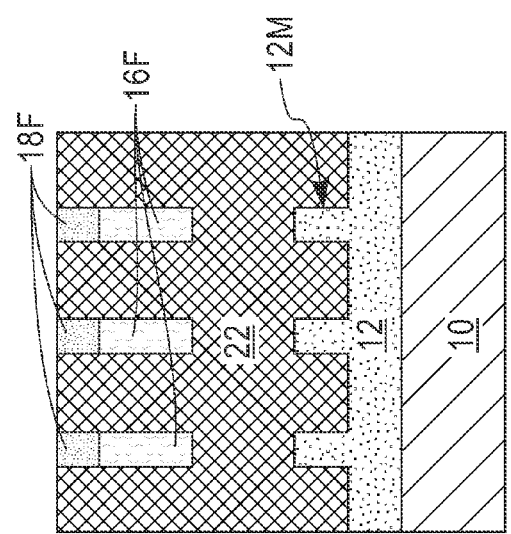
FIG. 5B is a cross sectional view of the exemplary semiconductor structure of FIG. 5A along vertical plane B-B'.

Referring now to FIGS. 5A-5C, there is illustrated the exemplary semiconductor structure of FIGS. 4A-4C after performing a fin cutting step. The fin cutting step includes lithography and etching as defined above.

The fin cutting step removes portions of each pre-pad structure 100 and portions of each pre-fin structure 102 and provides an opening 24 between the remaining portions of each pre-pad structure 100 and the remaining portions of each pre-fin structure 102. Each remaining pre-fin structure 102 can now be referred to as a fin structure 102S, and each remaining pre-pad structure 100 can now be referred to as a pad structure 100S. The pad structures 100S are now spaced apart from the fin structures 102S by opening 24.

Each fin structure 102S comprises, from bottom to top, a remaining portion of the III-V compound semiconductor channel layer portion 16 (hereinafter referred to as III-V compound semiconductor channel fin portion 16F) and a remaining portion of the hard mask layer portion 18 (hereinafter referred to as hard mask fin portion 18F). Each pad structure 100S includes, from bottom to top, a second III-V compound semiconductor buffer layer pillar portion 14P, a remaining portion of the III-V compound semiconductor channel layer portion 16 (hereinafter referred to as III-V compound semiconductor channel material pad portion 16P) and a remaining portion of the hard mask layer portion 18 (hereinafter referred to as hard mask pad portion 18P). As is shown, a portion of the first dielectric material 22 remains beneath each fin structure 102S (i.e., the bottommost surface of the III-V compound semiconductor channel fin portion 16F is located directly on a topmost surface of a portion of the dielectric material 22).

In one embodiment, and as shown, the hard mask fin portion 18F and the III-V compound semiconductor channel fin portion 16F have sidewall surfaces that are vertically coincident to each other. As is also shown, the III-V compound semiconductor buffer layer pillar portion 14P, the III-V compound semiconductor channel material pad portion 16P, and the hard mask pad portion 18P have sidewall surfaces that are vertically coincident to each other. As is shown in FIG. 5B, the sidewall surfaces of the hard mask fin portion 18F, and the III-V compound semiconductor channel fin portion 16F are vertically coincident to the sidewall surfaces of the mesa portion 12M of the underlying first semiconductor buffer layer portion 12.

Figure 6A:
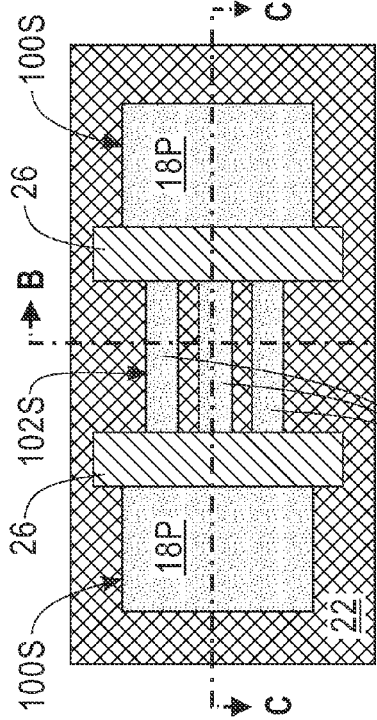
FIG. 6A is a top-down view of the exemplary semiconductor structure of FIGS. 5A-5C after forming a second dielectric material within each opening provided by the fin cutting step.
Figure 6C:
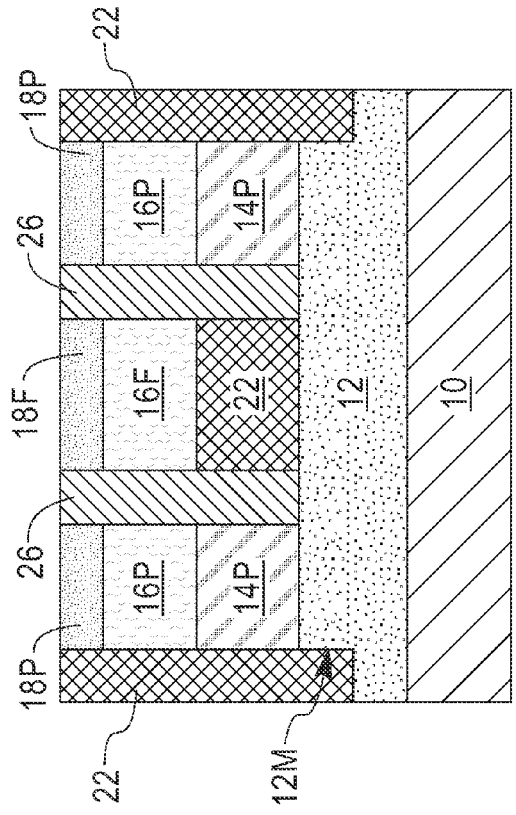
FIG. 6C is a cross sectional view of the exemplary semiconductor structure of FIG. 6A along vertical plane C-C'.
Figure 6B:
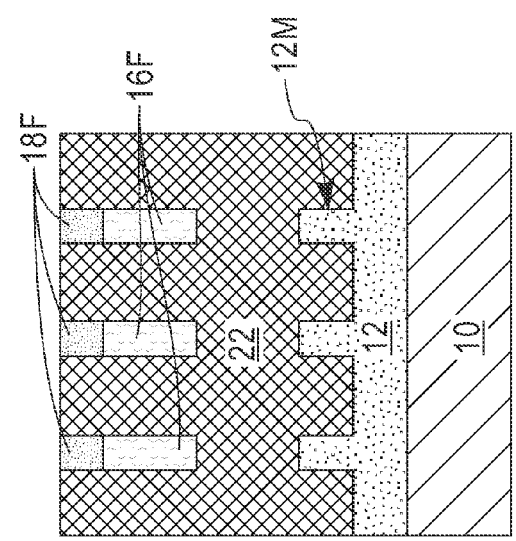
FIG. 6B is a cross sectional view of the exemplary semiconductor structure of FIG. 6A along vertical plane B-B'.

Referring now to FIGS. 6A-6C, there is illustrated the exemplary semiconductor structure of FIGS. 5A-5C after forming a second dielectric material 26 within each opening 24 provided by the fin cutting step. The second dielectric material 26 may comprise a dielectric material as mentioned above for first dielectric material 22. In some embodiments, the second dielectric material 26 comprises a same dielectric material, e.g., silicon dioxide, as the first dielectric material 22. In other embodiments, the second dielectric material 26 comprises a different dielectric material than the first dielectric material 22. The second dielectric material 26 completely fills each opening 24 and can be formed by deposition of a dielectric material, followed by an etch back and/or planarization process. The second dielectric material 26, the first dielectric material 24, each pad structure 100S and each fin structure 102S have topmost surfaces that are coplanar with each other.

Referring now to FIGS. 7A-7C, there is illustrated the exemplary semiconductor structure of FIGS. 6A-6C after recessing the second dielectric material 26 within each opening 24 provided by the fin cutting step. The portions of the second dielectric material 26 that remain after the recessing can be referred to here as second dielectric material portions 26P. In some embodiments, and as shown, the first dielectric material 22 can also be recessed at this point of the present application. The portions of the first dielectric material 22 that remain after the recessing are referred to as first dielectric material portions 22P. In some embodiments, the first dielectric material 22 is not recessed. In the embodiment shown, the first dielectric material portions 22P and the second dielectric material portions 26P have a same height; i.e., their topmost surfaces are coplanar with each other.

The recessing of the second dielectric material 26 exposes sidewall surfaces of each fin structure 102S. Notably, the sidewall surfaces of the III-V compound semiconductor channel fin portion 16F are now exposed after performing the recessing step. The recessing step can be performed utilizing an anisotropic etch that is selective in removing the dielectric material that provides the second dielectric material 26. In some embodiments, a block mask can be formed over exposed portions the first dielectric material 22 prior to performing the recessing step. In such an embodiment, the first dielectric material 22 is not recessed.

The recessing removes portions of the second dielectric material 26 such that the topmost surface of each second dielectric material portion 26P is located beneath the bottommost surface of the III-V compound semiconductor channel fin portion 16F. In some embodiments, the topmost surface of each second dielectric material portion 26P is located beneath a topmost surface of the first dielectric material 20 that remains beneath the III-V compound semiconductor channel fin portion 16F of each fin structure 102S.

Figure 8A:
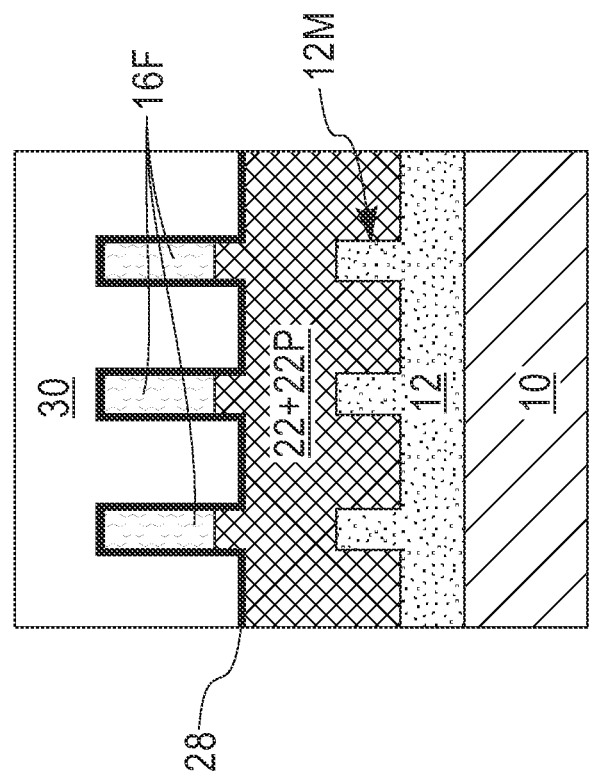
FIG. 8A is a cross sectional view of the exemplary semiconductor structure of FIG. 7B after forming a functional gate structure straddling over a III-V compound semiconductor channel fin portion provided by the fin cutting process.

Referring to FIG. 8A, there is illustrated the exemplary semiconductor structure of FIG. 7B after forming a functional gate structure (28, 30) straddling over a III-V compound semiconductor channel fin portion 16F provided by the fin cutting process. In this embodiment, the hard mask fin portion 18F remains. In this embodiment, the functional gate structure (28, 30) directly contacts only the sidewall surfaces of the III-V compound semiconductor channel fin portion 16F.

Figure 8B:
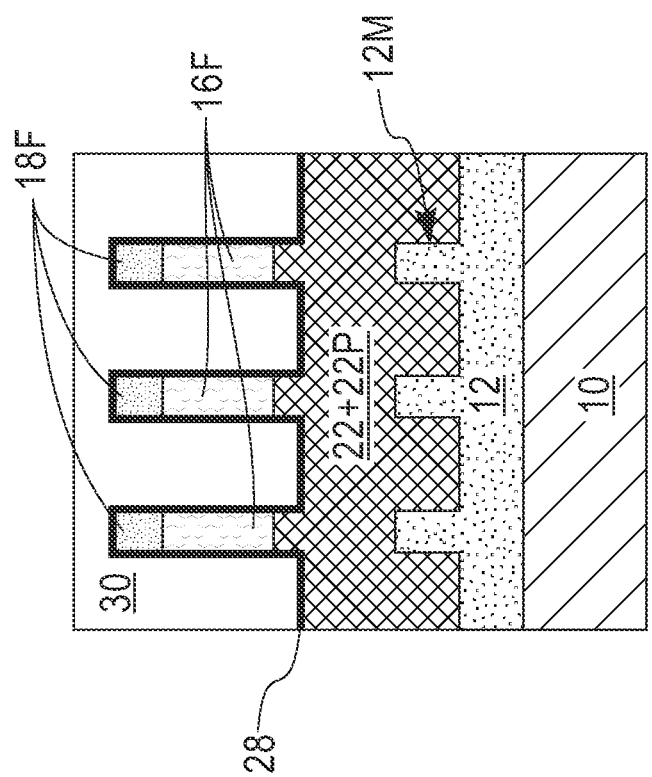
FIG. 8B is a cross sectional view of the exemplary semiconductor structure of FIG. 7B after removing the hard mask fin portion and forming a functional gate structure straddling over a III-V compound semiconductor channel fin portion provided by the fin cutting process.

In another embodiment, and as shown in FIG. 8B, the hard mask fin portion 18F is removed prior to forming the functional gate structure (28, 30). The removal of the hard mask fin portion 18F can be performed by planarization; the planarization process also removes the hard mask fin pad portion 18P from atop each pad structure 100S. In this embodiment, the functional gate structure (28, 30) directly contacts the sidewall surfaces and the topmost surface of the III-V compound semiconductor channel fin portion 16F.

By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed straddling over different portions of each fin structure 102S. Each functional gate structure includes a gate material stack of, from bottom to top, a gate dielectric portion 28 and a gate conductor portion 30. In some embodiments, a gate cap portion (not shown) can be present atop each gate conductor portion 30.

Each gate dielectric portion 28 of the functional gate structure comprises a gate dielectric material. The gate dielectric material that provides each gate dielectric portion 28 can be an oxide, nitride, and/or oxynitride. In one example, the gate dielectric material that provides each gate dielectric portion 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion 28. In some embodiments, each gate dielectric portion 28 comprises a same gate dielectric material. In other embodiments, a first set of functional gate structures comprises a first gate dielectric material while a second set of functional gate structures comprises a second gate dielectric material that differs from the first gate dielectric material.

The gate dielectric material used in providing each gate dielectric portion 28 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions 28 of different functional gate structures, block mask technology can be used. In one embodiment of the present application, the gate dielectric material used in providing each gate dielectric portion 28 can have a thickness in a range from 1 nm to 10 nm. Other thicknesses that are lesser than, or greater than, the aforementioned thickness range can also be employed for the gate dielectric material.

Each gate conductor portion 30 of the functional gate structure comprises a gate conductor material. The gate conductor material used in providing each gate conductor portion 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 30 comprises a same conductive material. In other embodiments, the gate conductor portion of a first functional gate structure comprises a different gate conductor material than a gate conductor portion of a second set of functional gate structures. For example, the gate conductor portion of a first set of functional gate structure may comprise an nFET gate metal, while the gate conductor portion of a second set of functional gate structure may comprise a pFET gate metal.

The gate conductor material used in providing each gate conductor portion 30 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing each gate conductor portion 30 has a thickness from 1 nm to 100 nm. Other thicknesses that are lesser than, or greater than, the aforementioned thickness range can also be employed for the gate conductor material used in providing each gate conductor portion 30.

If present, the gate cap portion of the functional gate structure comprises a gate cap material. The gate cap material that provides the gate cap portion may include one of the hard mask materials mentioned above. In one embodiment, each gate cap portion comprises silicon dioxide, silicon nitride, and/or silicon oxynitride. The material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers (not shown) can be formed on exposed sidewall surfaces of the respective gate structure. The dielectric spacers may comprise one of the dielectric materials mentioned above for dielectric spacers used in the SIT process. The dielectric spacers can be formed by depositing a spacer material and thereafter a spacer etch can be performed. Next, a source region (not shown) is formed on one side of each gate structure and a drain region (not shown) is formed on another side of each gate structure. The source region and the drain region would run into an out of the plane of the paper including the exemplary semiconductor structure shown in FIGS. 8A and 8B. The source/drain regions may including formation of a doped epitaxial semiconductor material on exposed portions of each III-V compound semiconductor channel fin portion 16F. In one embodiment, the doped epitaxial semiconductor material of one fin structure 102S that is formed may merge with another doped epitaxial semiconductor material of another fin structure 102S. In another embodiment, the doped epitaxial semiconductor material of one fin structure 102S that is formed may remain unmerged from another doped epitaxial semiconductor material of another fin structure 102S.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a III-V material stack on a surface of a bulk semiconductor substrate, said III-V material stack comprising from bottom to top, a first III-V compound semiconductor buffer layer, a second III-V compound semiconductor buffer layer, and a III-V compound semiconductor channel layer;
   patterning said III-V material stack to provide at least one pre-fin structure located between and directly contacting a pair of pre-pad structures;
   suspending a remaining portion of said III-V compound semiconductor channel layer within said at least one pre-fin structure using each pre-pad structure as an anchoring element;

forming a first dielectric material surrounding said at least one pre-fin structure and said pair of pre-pad structures, wherein a portion of said first dielectric material fills a gap located between said remaining portion of said III-V compound semiconductor channel layer that is suspended within said pre-fin structure and an underlying remaining portion of said first III-V compound semiconductor buffer layer;

performing a fin cutting process to provide openings separating remaining portions of said at least one pre-fin structure and remaining portions of said pair of pre-pad structures; and forming a second dielectric material within each opening, said second dielectric material having a topmost surface that is located beneath a bottommost surface of said remaining portion of said III-V compound semiconductor channel layer of said remaining portions of said at least one pre-fin structure.

2. The method of claim 1, wherein a hard mask layer is formed on a surface of said III-V compound semiconductor channel layer of said III-V material stack prior to said patterning said III-V material stack.

3. The method of claim 1, wherein said patterning said III-V material stack comprises, in any order, a fin patterning process and a pad patterning process.

4. The method of claim 1, wherein said suspending said remaining portion of said III-V compound semiconductor channel layer within said at least one pre-fin structure comprises an etching process that is selective in removing said second III-V compound semiconductor buffer layer within said pre-fin structure relative to said remaining portion of said first III-V compound semiconductor buffer layer within said pre-fin structure and said remaining portion of said III-V compound semiconductor channel layer within said pre-fin structure.

5. The method of claim 1, wherein said fin cutting process exposes a mesa portion of said remaining portion of said first III-V compound semiconductor buffer layer.

6. The method of claim 1, wherein said suspending leaves a III-V compound semiconductor channel layer pedestal portion within said pre-pad structure.

7. The method of claim 1, wherein said forming said second dielectric material comprises:

deposition of a dielectric material; and recessing said dielectric material.

8. The method of claim 1, wherein said remaining portions of said at least one pre-fin structure provide at least one fin structure that comprises said remaining portion of said III-V compound semiconductor channel layer located on a surface of a portion of said first dielectric material that is located within said gap.

9. The method of claim 8, further comprising forming a functional gate structure straddling over said remaining portion of said III-V compound semiconductor channel layer of said remaining portions of said at least one pre-fin structure.

10. The method of claim 8, wherein said forming said functional gate structure comprises providing a sacrificial gate structure straddling over said remaining portion of said III-V compound semiconductor channel layer of said remaining portions of said at least one pre-fin structure, forming source regions and drain regions on exposed portions of said remaining portion of said III-V compound semiconductor channel layer of said remaining portions of said at least one pre-fin structure, and replacing said sacrificial gate structure with said functional gate structure.

11. The method of claim 1, wherein said III-V material stack is formed by epitaxial deposition.

12. The method of claim 1, wherein said first III-V compound semiconductor buffer layer comprises a different III-V compound semiconductor than said second III-V compound semiconductor buffer layer.

* * * * *